US008953366B2

(12) United States Patent  
Wolf et al.

(10) Patent No.: US 8,953,366 B2
(45) Date of Patent: Feb. 10, 2015

(54) MAGNETIC RANDOM ACCESS MEMORY DEVICE

(75) Inventors: Stuart A. Wolf, Bowie, MD (US); Jiwei Lu, Glen Allen, VA (US); Mircea R. Stan, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 13/697,092

(22) PCT Filed: May 11, 2011

(86) PCT No.: PCT/US2011/036137
§ 371 (c)(1),
(2), (4) Date: Nov. 9, 2012

(87) PCT Pub. No.: WO2011/143356
PCT Pub. Date: Nov. 17, 2011

(65) Prior Publication Data
US 2013/0058157 A1    Mar. 7, 2013

Related U.S. Application Data

(60) Provisional application No. 61/333,485, filed on May 11, 2010, provisional application No. 61/388,000, filed on Sep. 30, 2010.

(51) Int. Cl.
*G11C 11/00* (2006.01)
*G11C 11/14* (2006.01)

(52) U.S. Cl.
CPC ....................................... *G11C 11/14* (2013.01)
USPC ............................ 365/158; 365/171; 365/173

(58) Field of Classification Search
USPC ............................... 365/158, 171, 173, 51, 55
See application file for complete search history.

(56) References Cited

U.S. PATENT DOCUMENTS 7,705,340 B2 * 4/2010 Lin .................................... 257/2
8,315,087 B2 * 11/2012 Katou et al. .................. 365/158

* cited by examiner

*Primary Examiner* — David Lam
(74) *Attorney, Agent, or Firm* — Kilpatrick Townsend & Stockton LLP

(57) ABSTRACT

The present invention proposes an electronic memory device comprising a memory line including a memory domain. The memory line may contain a number of memory domains and a number of fixed domains, wherein each memory domain stores a single binary bit value. A multiferroic element may be disposed proximate to each memory domain allowing the magnetization of the memory domain to be changed using a spin torque current, and ensuring the stability of the magnetization of the domain when it is not being written. The domain boundary between the memory domain and one of its adjacent fixed domains may thereby be moved. An antiferromagnetic element may be disposed proximate to each fixed domain to ensure the stability of the magnetization of these. The value of each memory domain may be read by applying a voltage to a magnetic tunnel junction comprising the memory domain and measuring the current flowing through it.

34 Claims, 16 Drawing Sheets

MAGNETIC RANDOM ACCESS MEMORY DEVICE

CROSS-REFERENCES TO RELATED APPLICATIONS

This application is a national stage filing of International Application No, PCT/US2011/036137, filed May 11, 2011, which claims priority under 35 U.S.C. §119(c) to U.S. Provisional Application Ser. No. 61/333,485, filed May 10, 2010 and U.S. Provisional Application Ser. No. 61/388,000, filed Sep. 30, 2010, the disclosures of which are incorporated by reference in their entirety herein.

BACKGROUND OF THE INVENTION

Magnetoresistive Random Access Memory (MRAM) is a non-volatile computer memory technology that has been under development for several years. Unlike conventional RAM chip technologies, in MRAM data is typically stored by magnetic storage elements. Such elements may be formed from two ferromagnetic plates, each of which can hold a magnetic field, separated by a thin insulating layer. One of the two plates may be a permanent magnet set to a particular polarity. The field of the other plate may be changed to match that of an external field to store memory. This configuration is known as a spin valve. A memory device may be built, for example, from a grid of such "cells".

Reading of MRAM data may be accomplished by measuring the electrical resistance of the storage element. A particular element may be selected, for example, by powering an associated transistor which switches current from a supply line through the element to ground. Due to the magnetic tunnel effect, the electrical resistance of the cell changes due to the orientation of the fields in the two plates.

By measuring the resulting current, the resistance inside any particular element may be determined, and, from this, the polarity of the writable plate. For example, if the two plates have the same polarity this may be considered to mean "1", while if the two plates are of opposite polarity, the resistance will be higher, and may be interpreted as "0".

Data may be written to the elements using a pair of write lines arranged at right angles to each other, above and below the element. When current is passed through the lines, an induced magnetic field may be created at the junction, which the writable plate may pick up.

In general, a magnetic tunnel junction (MTJ) consists of two layers of magnetic material separated by an insulator. If a voltage is applied across the two materials, a current may be induced to flow through the magnetic tunnel junction. This current will differ based on whether the magnetizations of the two magnetic materials are parallel or antiparallel.

As described above in the context of MRAM, a single bit of data may be stored in an MTJ in this manner. For example, the MTJ can be deemed to store the value of "1" if the magnetizations are antiparallel and "0" if the magnetizations are parallel. The bit can be read by applying a voltage to the MTJ and measuring the current passing through. When an MTJ is used to store data as MRAM, one of the layers may be deemed as the fixed layer, with static magnetization, and one of the layers may be deemed as the free layer, in which the direction of the magnetization is changed based on whether to store a "1" bit or a "0" bit.

The magnetization of the free layer of the MTJ may be changed using magnetic field writing. Despite ongoing research in the field, it has proven difficult to produce MRAM chips based on a transistor size less than 65nm when using magnetic field writing to change the magnetization of the free layer.

BRIEF SUMMARY OF THE INVENTION

The present invention proposes an electronic memory device and methods comprising a memory line including a memory domain. The memory line may contain a number of memory domains and a number of fixed domains, wherein each memory domain stores a single binary bit value. A multiferroic element may be disposed proximate to each memory domain allowing the magnetization of the memory domain to be changed using a spin torque current, and ensuring the stability of the magnetization of the domain when it is not being written. In embodiments, a piezoelectric element may be disposed proximate to each memory domain. In embodiments, the domain boundary between the memory domain and one of its adjacent fixed domains may be moveable. In embodiments, an antiferromagnetic element may be disposed proximate to, for example, a fixed domain.

In embodiments, the device may be a random access memory device. In embodiments, each of the memory domains may be separately writable based on a single current passed through the memory line. The memory domains may be independently writable, for example, according to whether a voltage is applied to the respective multiferroic element.

In embodiments, the antiferromagnetic elements may comprise materials with different Néel temperatures, and/or materials that form different exchange biases with the memory line.

In embodiments, the multiferroic element may exhibits antiferromagnetism and ferroelectricity. In embodiments, the multiferroic element may comprise, for example, BiFeO3. In embodiments, the multiferroic element may comprise a first material that is antiferromagnetic and a second material that is ferroelectric.

Embodiments may include a plurality of memory lines, wherein at least one single multiferroic element is disposed proximate to memory domains included in the plurality of memory lines.

Embodiments may include a plurality of multiferroic elements, wherein the plurality of memory lines are disposed substantially orthogonal to the multiferroic elements.

In embodiments, each memory domain may be included in a magnetic tunnel junction (MTJ). In embodiments, each memory domain may be proximate to a magnetic tunnel junction (MTJ). In embodiments, the memory domain may exhibit a magnetization direction that is substantially parallel to a fixed domain that is also part of the MTJ. In embodiments, the memory domain may exhibit a magnetization direction that is substantially orthogonal to a fixed domain that is also part of the MTJ.

According to further aspects of the invention, various methods of writing data to and/or reading data from a storage device may also be provided. For example, a method writing data to a memory line with a plurality of memory domains, may include providing a voltage to selected multiferroic elements proximate to respective memory domains; providing a current to the memory line; and changing a position of domain walls associated with each of the respective domains.

Embodiments may include reading the value of at least one magnetic tunnel junction (MTJ) by passing a current through the MTJ.

According to further aspects of the invention, various methods of manufacturing storage devices may also be provided. For example, a method for manufacturing a magnetic memory device may include heating the device to a temperature that is above both a Néel temperature of a first antiferromagnetic material included in the device and a Néel temperature of a second antiferromagnetic material included in the device; applying a first magnetic field with a first direction to the device; cooling the device to a temperature between the Néel temperature of the first antiferromagnetic material included in the device and the Néel temperature of the second antiferromagnetic material included in the device; and applying a second magnetic field with a direction that is antiparallel to the first direction to the device Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings.

DETAILED DESCRIPTION OF THE INVENTION

Figure 1:
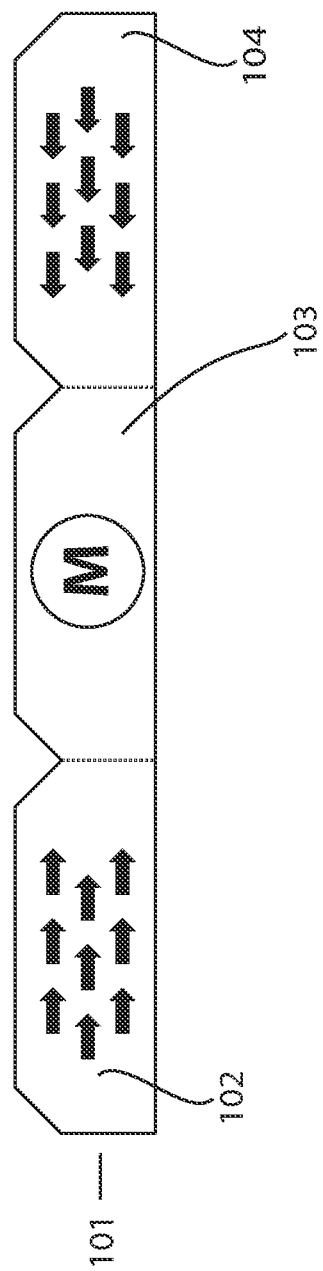
FIG. 1 shows an exemplary memory line according to aspects of the present invention.

It is understood that the invention is not limited to the particular methodology, protocols, and reagents, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a bit" is a reference to one or more bits and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

Binary data may be stored in a ferromagnetic material by magnetizing the material in one direction to represent the binary value "0" and in a different direction to represent the binary value "1". A number of bits of data can be stored in a single piece of ferromagnetic material by separating the material into magnetic domains that are magnetized differently. In an embodiment of the present invention, a strip of ferromagnetic material is used to store a number of bits of binary data by allocating magnetic domains along the strip. Such a strip is herein referred to as a memory line.

The magnetic domains along the memory line may be allocated as memory domains and fixed domains, where memory domains are used to store data, and therefore have changeable magnetization, whereas fixed domains have a permanent magnetization.

FIG. 1 shows a section of such a memory line (101), including a memory domain (103) and two fixed domains, (102) and (104).

FIG. 2 shows four memory lines that are part of an MRAM device in accordance with an embodiment of the invention. The FIG. shows a memory line (201), wherein the areas denoted (202), (203) and (204) function as the free layer of three separate MTJs. Each of these areas is part of a magnetic domain; this magnetic domain may be called a memory domain because the direction of magnetization in the domain represents the data stored in the domain.

In an embodiment of the invention, a fixed domain, a magnetic domain with a fixed magnetization direction is placed between each memory domain. An example of such domains can be seen in FIG. 2. The areas marked (205), (206), (207) and (208) are examples of such domains.

The four memory lines shown in FIG. 2 can store 12 bits of data. Each memory line can store 3 bits of data and includes three memory domains, and four fixed domains. The fixed domains are magnetized in alternating directions as shown by the arrow texture.

Figure 2A:
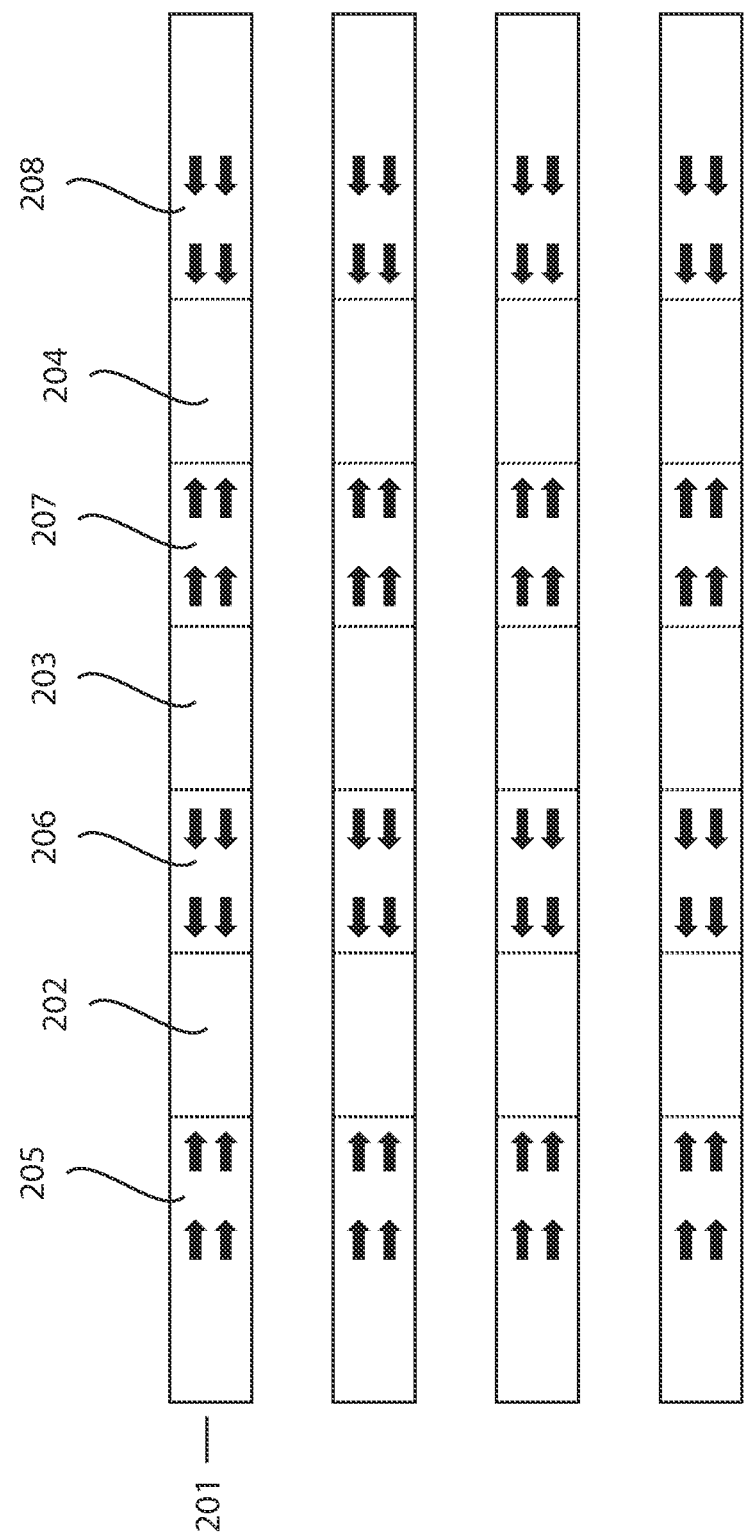
FIG. 2A shows four memory lines of a magnetic random access memory device implementing an embodiment of the present invention.
Figure 2B:
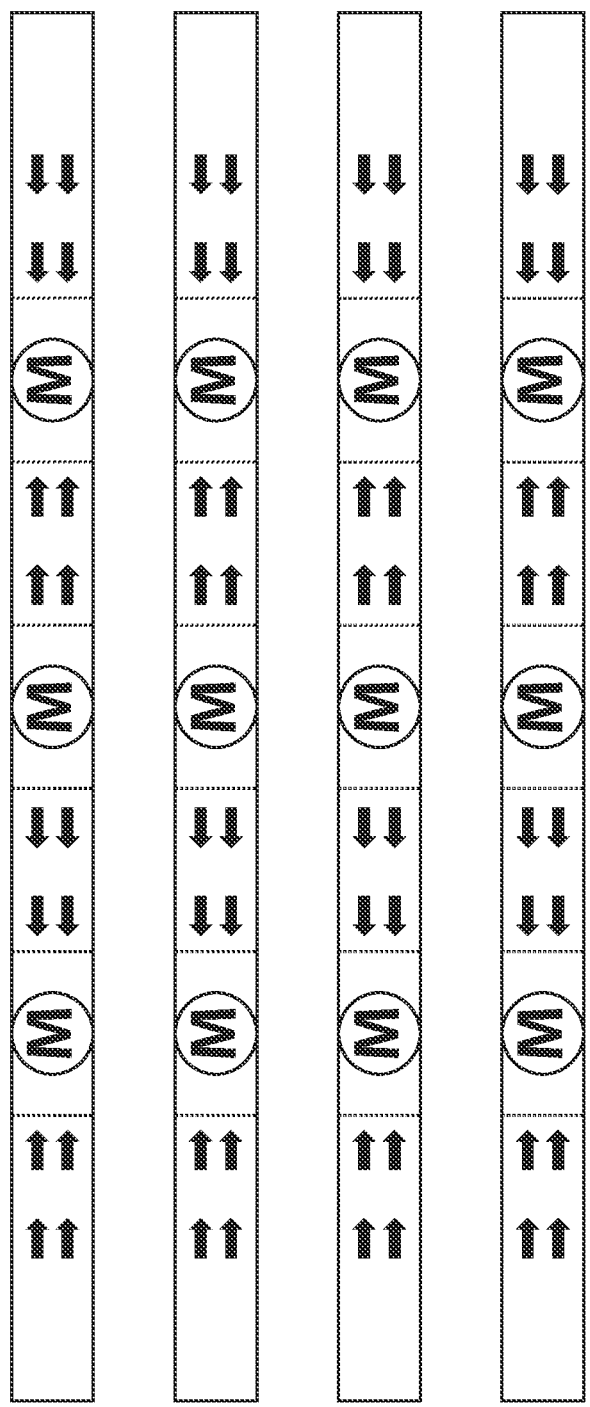
FIG. 2B shows the four memory lines shown in FIG. 2, wherein each memory domain has been marked with the letter "M".

FIG. 2B shows the same four memory lines that are shown in FIG. 2A, but each memory domain is denoted with the letter M. The magnetization of the memory domains in FIGS. 1 and 2 is not shown and accordingly additional domain walls are shown.

Figure 3:
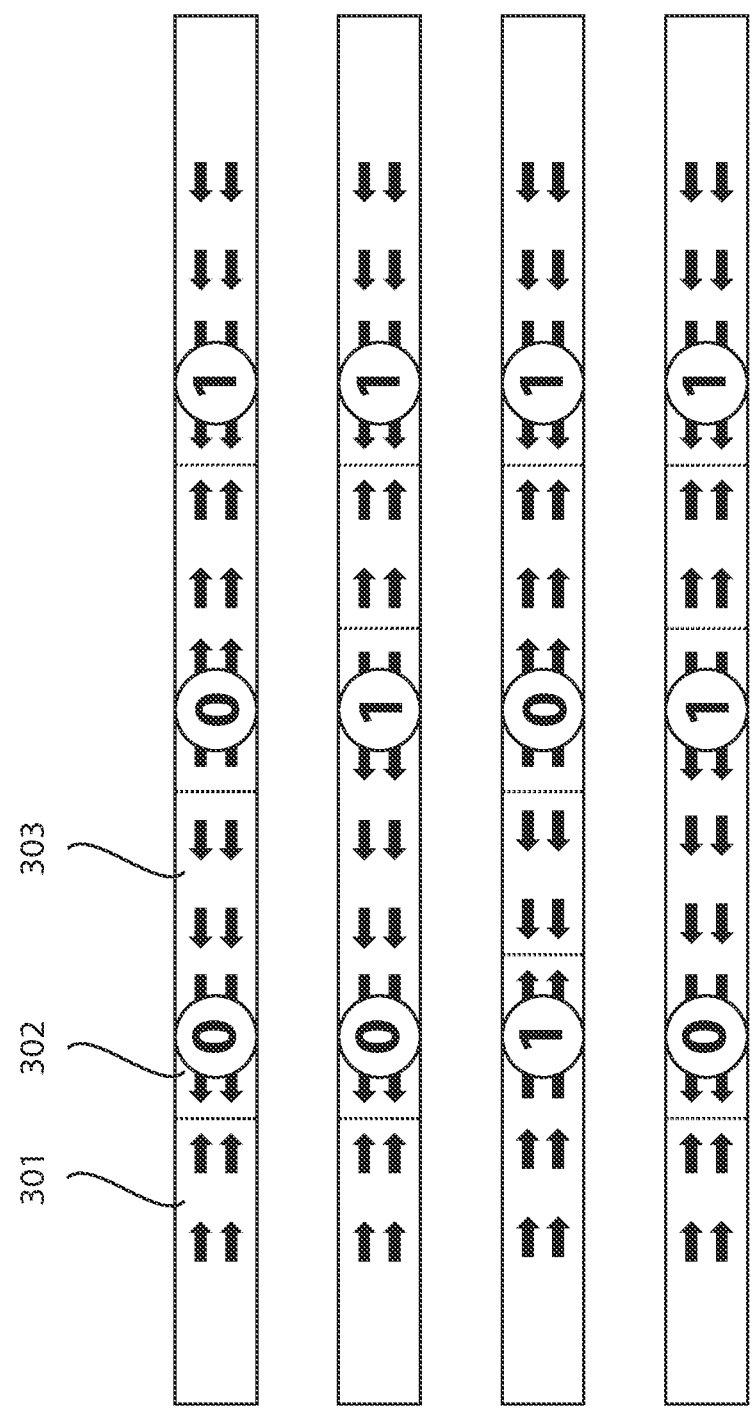
FIG. 3 shows the four memory lines shown in FIG. 2 wherein data has been written to the memory domains.

FIG. 3 shows the same four memory lines shown in FIG. 2. The binary data "001011101011" has been stored in the memory domains. The magnetization of each memory domain is shown with arrows, and the data stored in each memory domain is denoted with a "0" or "1" above each domain. As can bee seen in the figure, as a memory domain is magnetized, there will be a domain wall between the memory domain and the adjacent fixed domain which has antiparallel magnetization, but no domain wall between the memory domain and the fixed domain with has parallel magnetization. For example, memory domain (302) is magnetized in parallel with the fixed domain (303), and accordingly there is no domain wall between the memory domain and the fixed domain. On the other hand, fixed domain (301) is magnetized antiparallel to memory domain (302) and accordingly there is a domain wall between the two.

Figure 4:
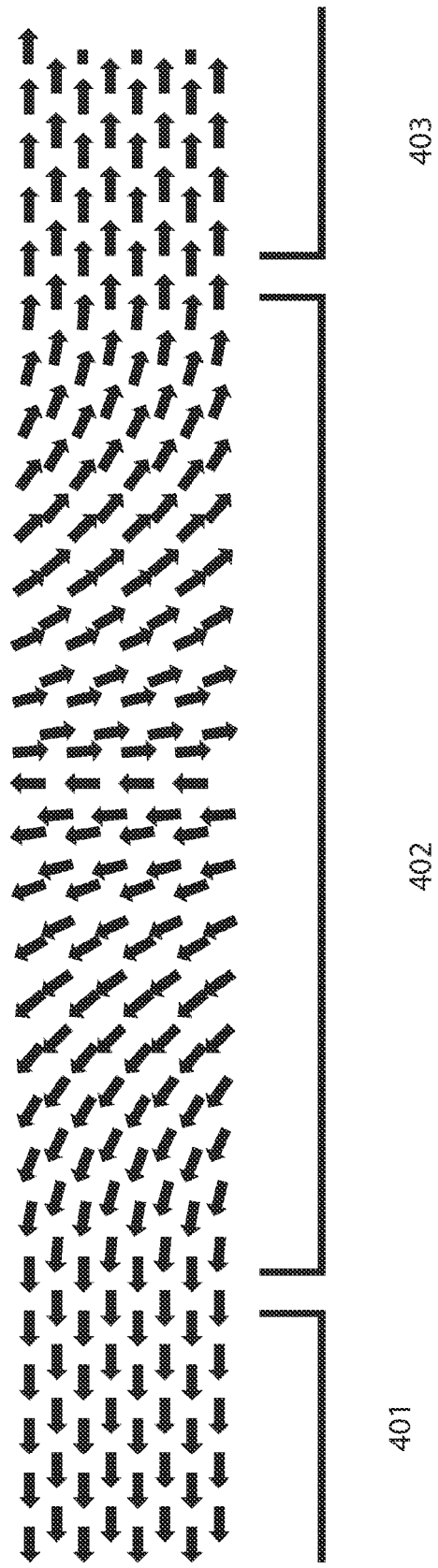
FIG. 4 shows the localized magnetization of two adjacent magnetic domains and the domain wall between them.

FIG. 4 shows the magnetization of a ferromagnetic material with two areas of antiparallell magnetization. The area denoted (401) comprises one magnetic domain, and the area denoted (403) comprises another magnetic domain of opposite magnetization. The area between these two domains (402) comprises the domain wall, the area where the magnetization changes. As can be seen, the magnetization does not change instantaneously, but over a small area. Depending on the coercivity of the ferromagnetic material, the domain wall may drift and thereby change the positioning of the magnetic domains.

If the domain walls in a memory line in an MRAM device drift, the data stored in the device may become unreadable or corrupted. An embodiment of the invention therefore uses antiferromagnetic materials placed proximate to the fixed domains to ensure that the magnetization of the fixed domains does not change.

Figure 5:
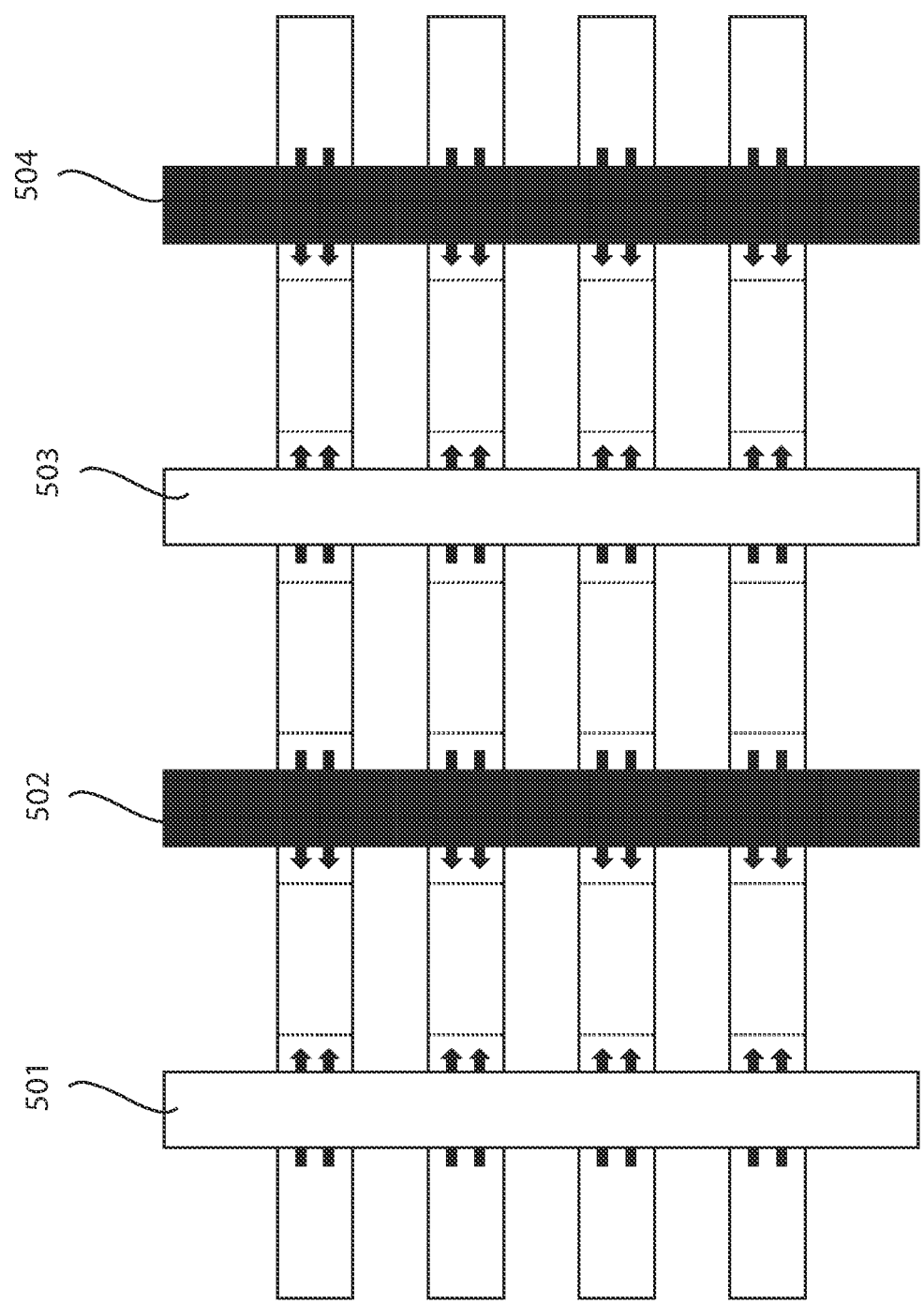
FIG. 5 shows the four memory lines shown in FIG. 2 with antiferromagnetic elements above the fixed domains.

In an embodiment of the invention, pieces of antiferromagnetic material may be placed orthogonally to the memory lines such that each piece of antiferromagnetic material is close to one fixed domain in each memory line. FIG. 5 shows the same four memory lines shown in FIGS. 1, 2 and 3, but with four pieces of antiferromagnetic material, labeled (501), (502), (503) and (504) laid orthogonally to the memory lines.

In an embodiment of the invention, two different types of antiferromagnetic material is used. As can be seen in FIG. 5, the pieces labeled (501) and (503) are of one type of antiferromagnetic material, and the pieces labeled (502) and (504) are of a different type of antiferromagnetic material, and the magnetization of the fixed domains corresponding to each piece of antiferromagnetic element is parallel.

In an embodiment of the invention, the use of two different types of antiferromagnetic materials may be exploited to properly magnetize the fixed domains during the production of an MRAM device. The MRAM device may need an initial setup to configure the magnetization in the memory line. The two materials, AFM1 and AFM2 may be two antiferromagnetic materials with different Néel temperatures ($T_{N1}$>$T_{N2}$) so that the exchange bias between AFM1 and the memory line and the exchange bias between AFM2 and memory line can be set at different temperatures.

The MRAM device may first be heated to a temperature that is higher than both the Néel temperatures, such that both the antiferromagnetic elements no longer exhibit antiferromagnetism and all the fixed domains become writable. By then subjecting the entire device to a large magnetic field all the fixed domains are magnetized parallelly. By lowering the temperature to one between $T_{N1}$ and $T_{N2}$, the AFM1 elements begin to exhibit antiferromagnetism and those fixed domains that are proximate to an AFM1 element are no longer writable, but the other fixed domains remain writable. By then subjecting the entire device to a large magnetic field that is antiparallel to the previous field used, the remaining fixed fields are magnetized antiparallel to the ones proximate to AFM2 elements. The domain walls (the broken lines in FIGS. 1, 2, 3, 5 and 6 will be generated at the notches in the write line due to the shape induced stability. These notches can be seen in FIGS. 7-10. Once the domains near AFM1 and AFM2 form, the magnetization direction of the fixed domains near the AFM1 and AFM2 elements will not be changed during consequent write/read operations. The parallel configuration, i.e. the magnetization direction is parallel to the tunnel junction, is illustrated in FIGS. 1, 2, 3 and 5, but it should be appreciated that the magnetization can be also up/down (perpendicular to the tunnel junction depending on the selection of the ferromagnetic and antiferromagnetic materials.

Figure 6:
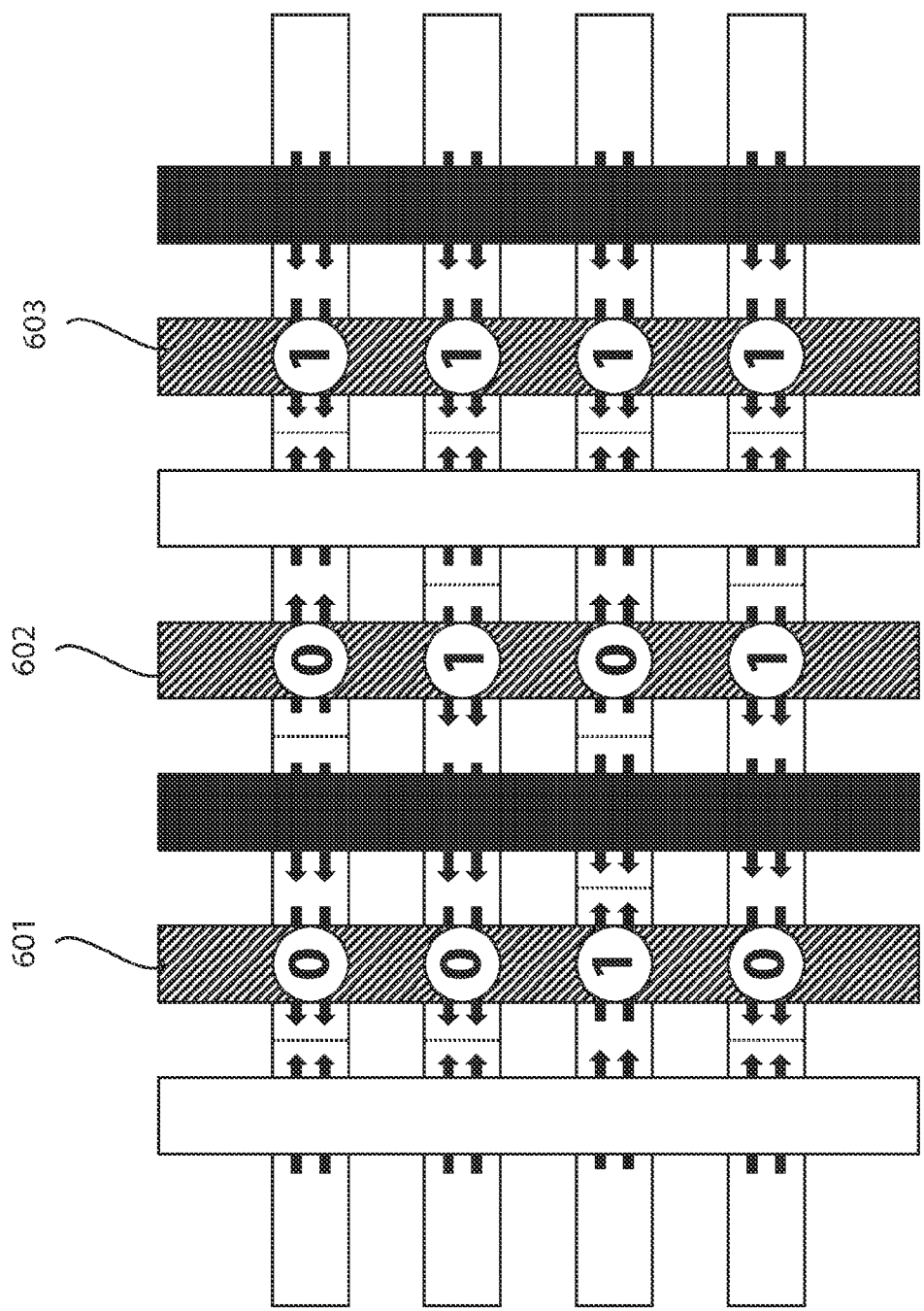
FIG. 6 shows the four memory lines shown in FIG. 2 with antiferromagnetic elements above the fixed domains and with multiferroic elements above the memory domains.

In order to ensure the stability of the magnetization of the memory domains, a third material exhibiting antiferromagnetism may be placed proximate to the memory domains. FIG. 6 shows the same four memory lines shown in FIGS. 1, 2, 3 and 5 with the two antiferromagnetic materials and a multiferroic element, exhibiting antiferromangetism and ferroelectricity placed near the memory domains. In an embodiment of the invention, this multiferroic may be $BiFeO_3$. In a different embodiment of the invention the multiferroic may be a composite material comprising an antiferromagnetic material and a ferroelectric material. Other materials that exhibit antiferromagnetism and ferroelectricity may also be used.

A magnetic random access memory device (MRAM) may be based on a matrix of magnetic tunnel junctions (MTJ) wherein each MTJ stores a single bit of data. Each MTJ comprises two ferromagnetic layers, one called the fixed layer with a fixed magnetization direction and one called the free layer with modifiable magnetization direction.

In an embodiment of the invention, a number of MTJs in an MRAM device may share a single piece of ferromagnetic material as the free layer, wherein a separate area of the material corresponds to each MTJ. For example, the single piece of ferromagnetic material may shaped like a ribbon with the free layers for each MTJ are placed along the ribbon.

FIG. 7 shows a cross-section of a part of an MRAM device in accordance with an embodiment of the present invention using an embodiment of the invention. (701) is a portion of the memory line, in which (702) is a fixed domain, (703) is a memory domain and (704) is another fixed domain. The magnetization of the two fixed domains is antiparallel. Above the fixed domain (702) is an antiferromagnetic element, above the memory domain (703) is a multiferroic element, and above the fixed domain (704) is a different antiferromagnetic element (706). Below the memory domain (703) is an insulator (709) and below the insulator is a fixed layer (708). In the embodiment shown in the figure, the memory domain (703) functions as the free layer in an MTJ comprising the fixed layer (708), the insulator (703) and the memory domain (703).

Figure 7A:
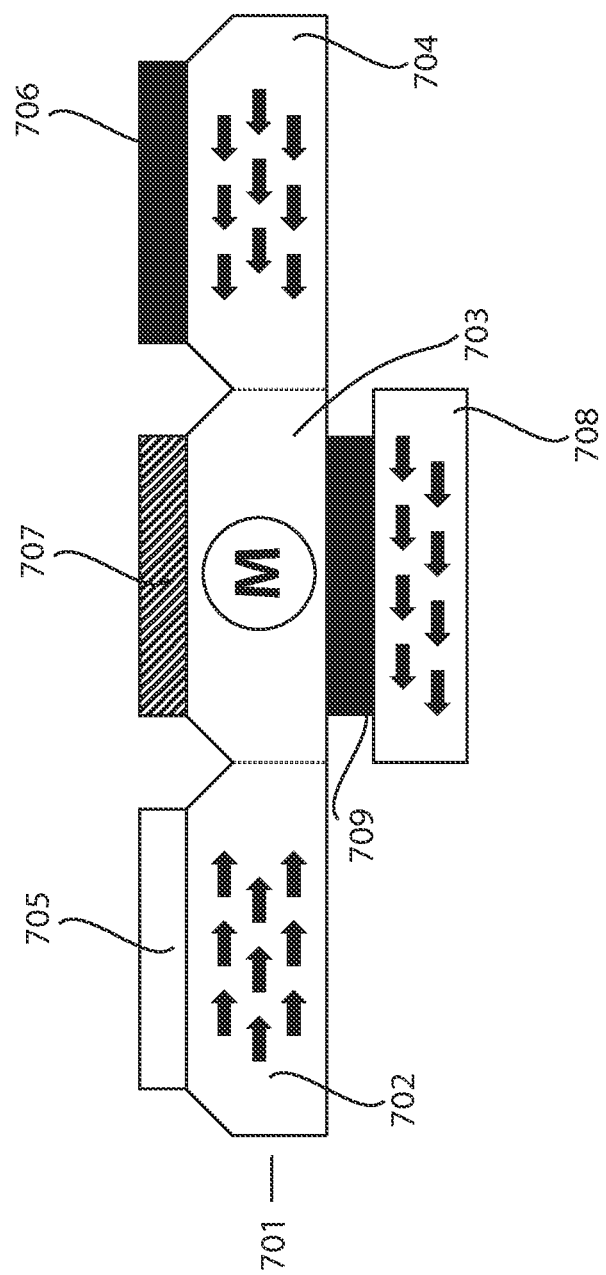
FIGS. 7A-7C show a magnetic tunnel junction as it may be used in an embodiment of the present invention, including various magnetizations.
Figure 7B:
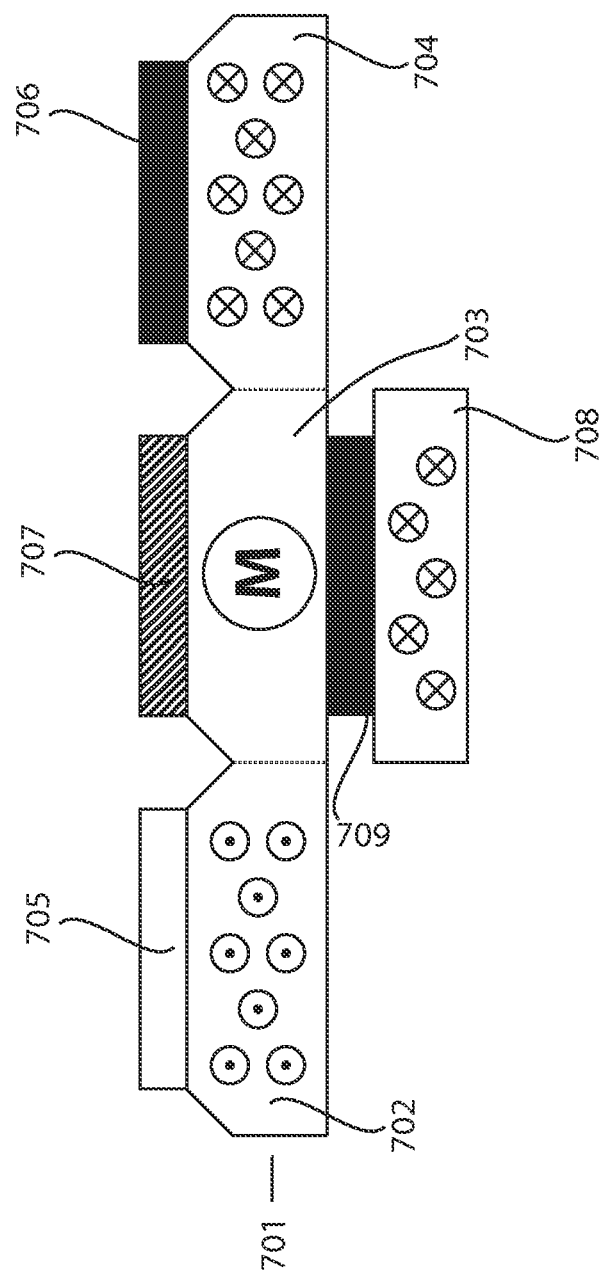
Figure 7C:
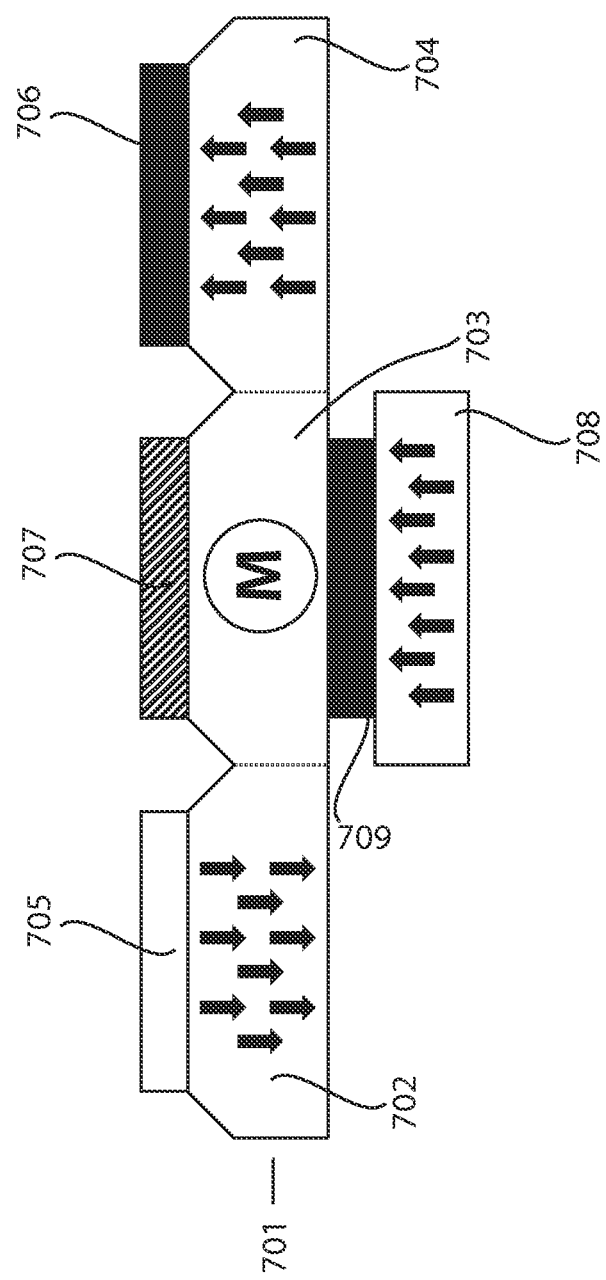

FIG. 7A shows magnetization that is parallel with the memory line. FIGS. 7B and 7C show magnetization that is orthogonal to the memory line.

Figure 8:
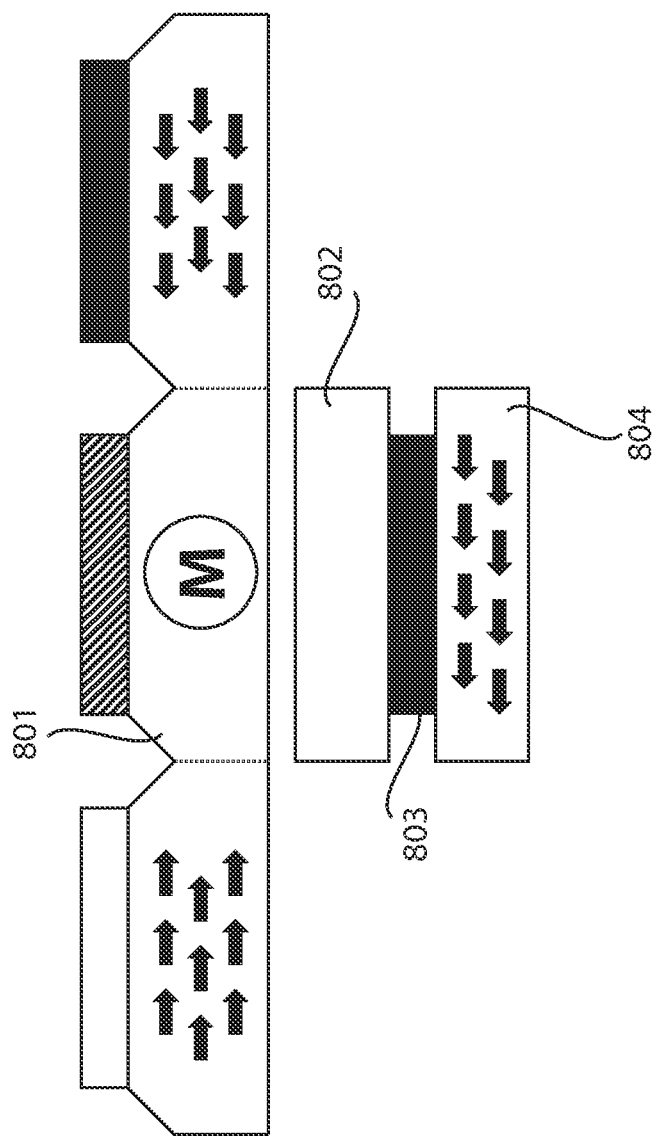
FIG. 8 shows further aspects of an exemplary magnetic tunnel junction, as may be used as a sensor for the magnetization of a memory domain, according to an embodiment of the present invention.

FIG. 8 shows an MRAM device in accordance with an alternative embodiment of the present invention, where the memory domain (801) is not part of the MTJ, but rather it induces magnetism into a separate piece of ferromagnetic material (802) that is proximate to it that functions as the free layer in the MTJ. In this configuration, the MTJ functions as a sensor for the magnetization of the memory domain. Hence, the MTJ comprises the free layer (802), the insulator (803) and the fixed layer (804).

In an embodiment of the invention, piezoelectric elements is used in place of multiferroic elements. These can have a similar effect on the hysteresis loop as the multiferroic. The piezoelectric elements may operate by straining the magnetic layer below it changing the coercive field, causing a similar effect to the change in antiferromagnetism caused by the multiferroic.

When the invention is applied to create an MRAM device using a grid as shown in FIG. 6, each multiferroic, (601), (602) and (603) may act as an exchange bias layer that pins the free layer at intervals. In an embodiment of the invention, the magnetization of the memory domains is changed by reducing the exchange bias between the multiferroic and the memory line. If a gate voltage is applied to any multiferroic segment then the exchange bias is reduced and the memory domain (703) is not pinned as strongly, so that a small spin torque current is sufficient to rotate the magnetization direction of the memory domain, and thereby moving the domain wall from one notch to the one on the other side of the junction as shown in FIG. 9.

Figure 9:
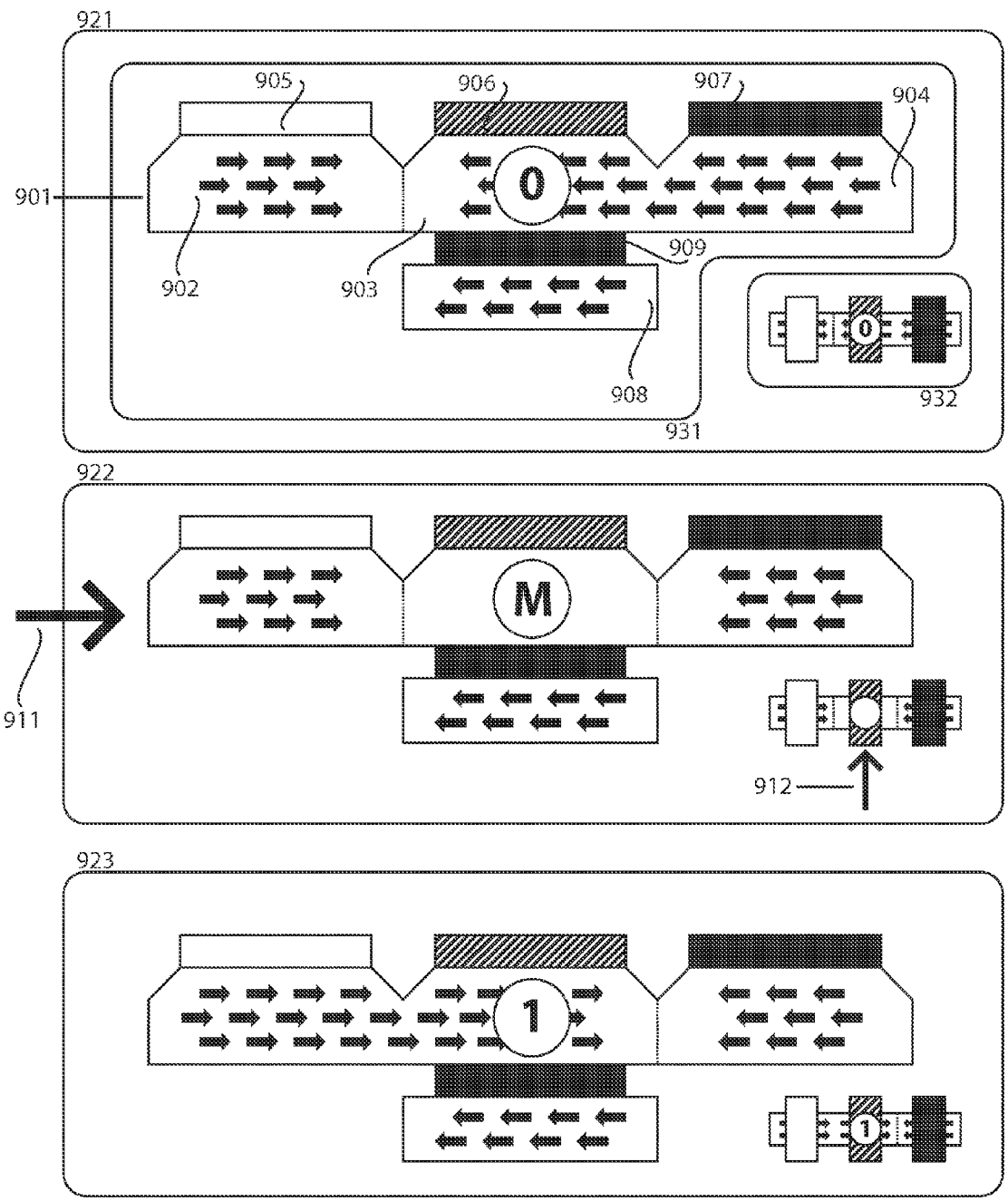
FIG. 9 shows three stages of a magnetic tunnel junction and a memory domain when data is stored in a magnetic random access memory device implementing an embodiment of the present invention.

FIG. 9 shows a segment of a memory line (901) with a first fixed domain (902), a memory domain (903) and a second fixed domain (904). Above the first fixed domain (902) is a first antiferromagnetic element (905), above the memory domain is a multiferroic element (906) and above the second fixed domain is a second antiferromagnetic element (907). The segment of the memory line is shown from two different angles; these are denoted (931) and (932). The magnetization of the domains is shown using an arrow texture. The device is first shown (921) storing the binary value of "0". The magnetization of the memory domain is parallel to the magnetization of the fixed layer (908).

The device is then shown in a first stage of the writing process (922) where a voltage (912) is applied to the multiferroic (906). As described above, the voltage reduces the exchange bias between the multiferroic and the memory line, and an induced current can then change the magnetization of the memory domain. To write the individual bit, a current (911) is again passed through the memory line and the junctions that are to be changed (written). To write "1": the spin polarized current travels from left to right and the spin polarization is determined by the magnetic domain to the left of the MTJ. The torque that the electric current carries will rotate the polarity of the free layer of the MTJ when the gate voltage is applied to the multiferroic and the polarity of free layer is anti-parallel to the spin polarity of the fixed layer of the MTJ, therefore the resistance of the MTJ is high, representing "1". To write "0", the current travels from right to left. Consequently, the polarity of free layer will be parallel to that of the fixed layer; hence the resistance of the MTJ is low, representing "0".

Applying this principle to the matrix layout shown in FIG. 6, where each memory line contains multiple memory domains, it is possible to write some or all of the MTJs in a memory line in two operations.

In one embodiment of the invention, a voltage is applied to all the multiferroic elements that cross the memory line, and a current is then passed through the memory line such that all the bits are set to either "1" or "0" depending on the direction of the current. If all the bits were set to "0" a voltage is then applied to the multiferroics associated with the MTJs that should be set to "1", and the opposite current is passed through the memory line. This will magnetize the memory domains associated with all those MTJs in an antiparallel direction to what they were.

In another embodiment, a voltage is first applied to the multiferroics associated with all the MTJs that should hold a value of "0", and a current is passed through the memory line. A voltage is then applied to all the multiferroics associated with MTJs that should hold a value of "1" and the opposite current is passed through the memory line.

Figure 13:
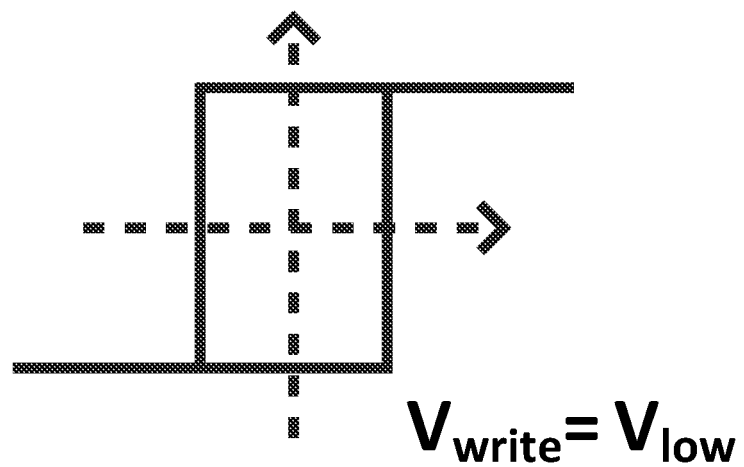
FIG. 13 shows hysteresis loops of the free layer underneath the multiferroic layers during a write operation in accordance with an embodiment of the invention.
Figure 13:
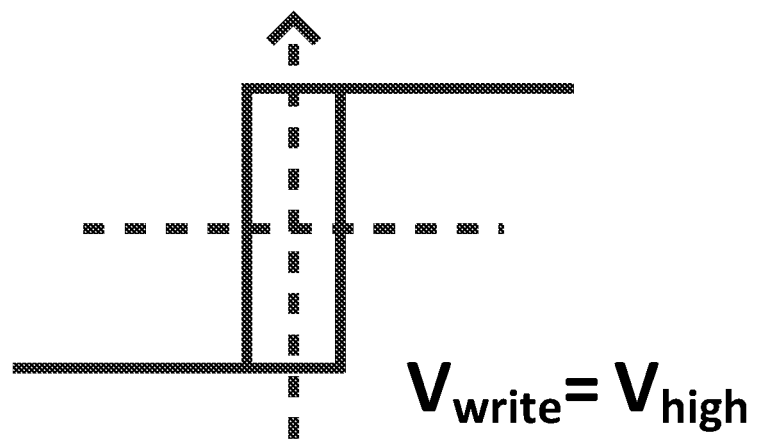

FIG. 13 shows the hysteresis loops of the memory line formed between the multiferroic element and the memory line when writing. The exchange bias is formed due to the coupling of the ferromagnetism of the memory line and the antiferromagnetism of the multiferroic. The application of a gate voltage onto the multiferroic element lifts the exchange bias so that the ferromagnetism in the free layer is more susceptible to change polarity.

Figure 10:
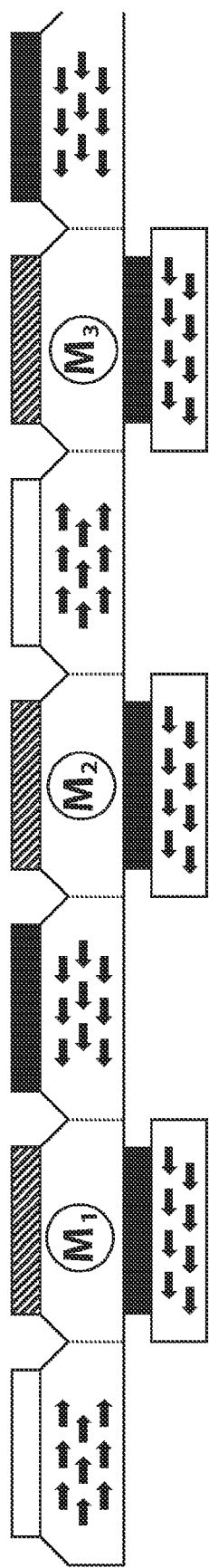
FIG. 10 shows a memory line in accordance with an embodiment of the present invention.
Figure 11:
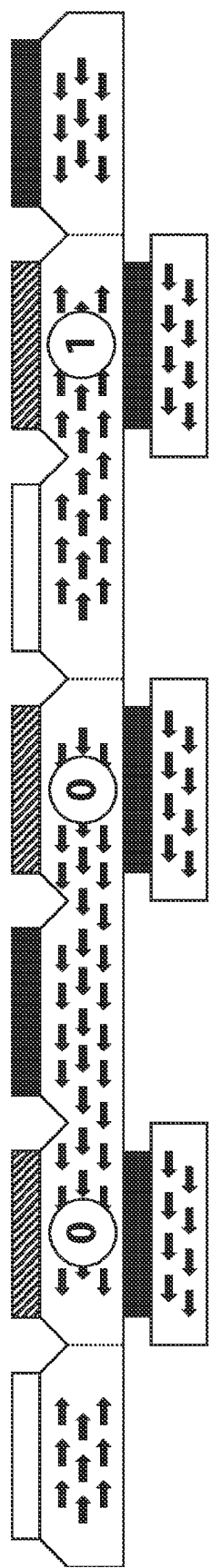
FIG. 11 shows an exemplary memory line in accordance with an embodiment of the present invention.

FIG. 10 shows a larger section of the MRAM device shown in FIG. 9. The section shown includes three memory domains and four fixed domains. The magnetization of the memory domains is not shown. FIG. 11 shows the same section of the MRAM device as shown in FIG. 10, but the magnetization of the memory domains is shown, and the resulting position of the domain walls.

Figure 12:
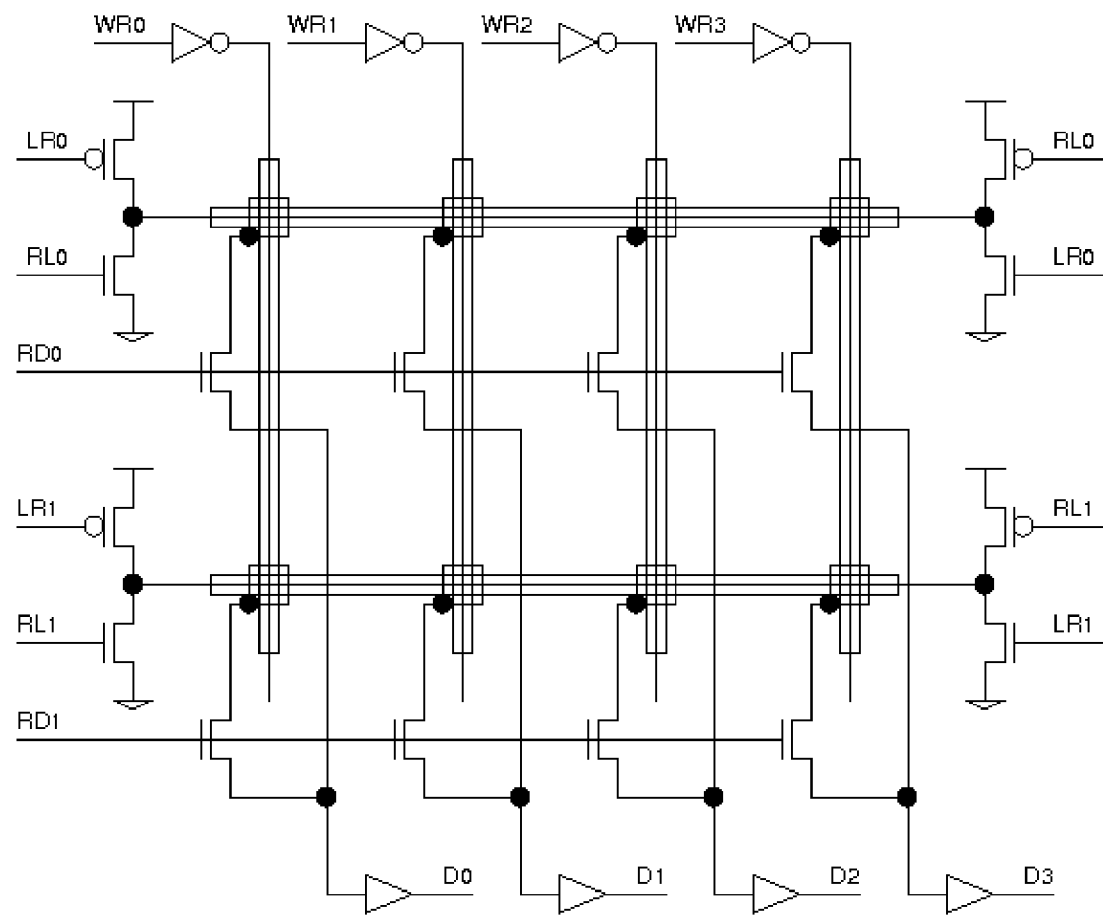
FIG. 12 shows an exemplary circuit diagram in accordance with an embodiment of the present invention.

FIG. 12 shows a diagram representing the logic gates used in an MRAM device implementing an embodiment of the invention. Each multiferroic segment has a gate electrode above it. If the configuration is as illustrated in FIG. 6, the free layer can either be on the bottom or the top and in the instance it is the bottom electrode then the multiferroic is below. The cross-bar circuit layout may be implemented to optimize the performance of such an MRAM device. The logic input (transistors and output may be only presented at the periphery of the array as illustrated. Four transistors are shown to control the write operation for each row of MTJs (for a matrix with four MTJs per row, which allow the spin torque transfer current to travel in either direction in order to write "1" and "0". One transistor is shown for each column, which can apply the electric field to MF hence select the bit to write. In addition, a low power transistor may be used to connect the MTJs in parallel for each column and it will be used to output the information stored in individual MTJs. The table below shows the respective logic inputs for the tasks listed:

| | operation | | | |
|---|---|---|---|---|
| Logic input | Write "1" | Write "0" | Read | Idle |
| $RL_i$ | "1" | "0" | "0" | "0" |
| $LR_i$ | "0" | "1" | "0" | "0" |
| $\overline{RL_i}$ | "0" | "1" | "1" | "1" |
| $\overline{LR_i}$ | "1" | "0" | "1" | "1" |

-continued

| | operation | | | |
|---|---|---|---|---|
| Logic input | Write "1" | Write "0" | Read | Idle |
| $\overline{WR_i}$ | "0" | "0" | "1" | "1" |
| $RD_i$ | "0" | "0" | "1" | "0" |

The description given above is merely illustrative and is not meant to be an exhaustive list of all possible embodiments, applications or modifications of the invention. Thus, various modifications and variations of the described methods and systems of the invention will be apparent to those skilled in the art without departing from the scope and spirit of the invention. Although the invention has been described in connection with specific embodiments, it should be understood that the invention as claimed should not be unduly limited to such specific embodiments. Indeed, various modifications of the described modes for carrying out the invention which are obvious to those skilled in the cellular and molecular biology fields, medical device field or related fields are intended to be within the scope of the appended claims.

The disclosures of all references and publications cited above are expressly incorporated by reference in their entireties to the same extent as if each were incorporated by reference individually.

What is claimed is:

1. An electronic memory device, comprising:
a memory line including a memory domain; and
a multiferroic element disposed proximate to the memory domain,
wherein, the device is configured to allow a position of a domain boundary for the domain to change when a voltage is applied to the multiferroic element.

2. The device of claim 1, wherein:
the memory line includes a plurality of memory domains, each memory domain with a multiferroic element; and
each of the memory domains is separately writable based on a single current passed through the memory line.

3. The device of claim 2, wherein the memory domains are independently writable according to whether a voltage is applied to the respective multiferroic element.

4. The device of claim 1, wherein the memory line includes a first fixed domain on one side of the memory domain and a second fixed domain on the other side of the memory domain; further comprising:
a first anti ferromagnetic element disposed proximate to the first fixed domain; and a second anti ferromagnetic element disposed proximate to the second fixed domain;
wherein the antiferromagnetic elements are configured to constrain possible locations of the domain boundary.

5. The device of claim 4, wherein the antiferromagnetic elements comprise materials with different Néel temperatures.

6. The device of claim 4, wherein the antiferromagnetic elements comprise materials that form different exchange biases with the memory line.

7. The device of claim 1, wherein the device is a random access memory device.

8. The device of claim 1, wherein the multiferroic element exhibits anti ferromagnetism and ferro electricity.

9. The device of claim 1, wherein the multiferroic element comprises $BiFeO_3$.

10. The device of claim 1 wherein the multiferroic element comprises a first material that is antiferromagnetic and a second material that is ferroelectric.

11. The device of claim 1, further comprising a plurality of memory lines,
wherein at least one single multiferroic element is disposed proximate to memory domains included in the plurality of memory lines.

12. The device of claim 11, further comprising a plurality of multiferroic elements,
wherein the plurality of memory lines are disposed substantially orthogonal to the multiferroic elements.

13. The device of claim 1, wherein each memory domain is included in a magnetic tunnel junction (MTJ).

14. The device of claim 13, wherein the memory domain exhibits a magnetization direction that is substantially parallel to a fixed domain that is also part of the MTJ.

15. The device of claim 13, wherein the memory domain exhibits a magnetization direction that is substantially orthogonal to a fixed domain that is also part of the MTJ.

16. The device of claim 1, wherein each memory domain is proximate to a magnetic tunnel junction (MTJ).

17. The device of claim 16, wherein the memory domain exhibits a magnetization direction that is substantially parallel to a fixed domain that is also part of the MTJ.

18. The device of claim 16, wherein the memory domain exhibits a magnetization direction that is substantially orthogonal to a fixed domain that is also part of the MTJ.

19. A random-access magnetic memory device, comprising:
a memory line including a plurality of memory domains; and
multiferroic elements disposed proximate to each of the memory domains,
wherein, the device is configured to allow a position of selected domain boundaries for a subset of the memory domains to change based on a voltage applied to a corresponding subset of the multiferroic elements and a current provided to the memory line.

20. The device of claim 19, wherein the memory line includes a first fixed domain on one side of the memory domain and a second fixed domain on the other side of the memory domain; further comprising:
a first antiferromagnetic element disposed proximate to the first fixed domain; and
a second anti ferromagnetic element disposed proximate to the second fixed domain;
wherein the antiferromagnetic elements are configured to constrain possible locations of the domain boundary.

21. The device of claim 20, wherein the antiferromagnetic elements comprise materials with different Néel temperatures.

22. The device of claim 20, wherein the antiferromagnetic elements comprise materials that form different exchange biases with the memory line.

23. The device of claim 20, wherein the multiferroic elements exhibit antiferromagnetism and ferro electricity.

24. The device of claim 19, wherein the multiferroic element comprises $BiFeO_3$.

25. The device of claim 19, wherein the multiferroic element comprises a first material that is anti ferromagnetic and a second material that is ferroelectric.

26. The device of claim 19, further comprising a plurality of memory lines;
wherein each of the multiferroic elements are disposed proximate to memory domains included in the plurality of memory lines.

27. The device of claim 19, wherein each memory domain is included in a magnetic tunnel junction (MTJ).

28. The device of claim 27, wherein each memory domain exhibits a magnetization direction that is substantially parallel to a fixed domain that is also part of the MTJ.

29. The device of claim 28, wherein each memory domain exhibits a magnetization direction that is substantially orthogonal to a fixed domain that is also part of the MTJ.

30. The device of claim 19, wherein each memory domain is proximate to a magnetic tunnel junction (MTJ).

31. The device of claim 30, wherein each memory domain exhibits a magnetization direction that is substantially parallel to a fixed domain that is also part of the MTJ.

32. The device of claim 30, wherein each memory domain exhibits a magnetization direction that is substantially orthogonal to a fixed domain that is also part of the MTJ.

33. A method of writing data to a storage device including a memory line with a plurality of memory domains, said method comprising:
   providing a voltage to selected multiferroic elements proximate to respective memory domains;
   providing a current to the memory line; and
   changing a position of domain walls associated with each of the respective domains.

34. The method of claim 33, further comprising reading the value of at least one magnetic tunnel junction (MTJ) by passing a current through the MTJ.

* * * * *